US009869715B2

(12) United States Patent
Ishimoto et al.

(10) Patent No.: US 9,869,715 B2
(45) Date of Patent: Jan. 16, 2018

(54) SEMICONDUCTOR WAFER INSPECTION APPARATUS AND SEMICONDUCTOR WAFER INSPECTION METHOD

(71) Applicant: Tokyo Seimitsu Co., Ltd., Tokyo (JP)

(72) Inventors: Takashi Ishimoto, Tokyo (JP); Yuji Shigesawa, Tokyo (JP); Akira Yamaguchi, Tokyo (JP); Takashi Motoyama, Tokyo (JP); Takenori Takahashi, Tokyo (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 15/236,297

(22) Filed: Aug. 12, 2016

(65) Prior Publication Data

US 2017/0010323 A1 Jan. 12, 2017

Related U.S. Application Data

(63) Continuation of application No. PCT/JP2015/070855, filed on Jul. 22, 2015.

(30) Foreign Application Priority Data

Dec. 16, 2014 (JP) ................................. 2014-253947

(51) Int. Cl.
*G01R 31/28* (2006.01)
*H01L 21/683* (2006.01)
(Continued)

(52) U.S. Cl.
CPC ..... *G01R 31/2875* (2013.01); *G01R 1/06705* (2013.01); *G01R 31/00* (2013.01);
(Continued)

(58) Field of Classification Search
None
See application file for complete search history.

(56) References Cited

U.S. PATENT DOCUMENTS 6,280,081 B1    8/2001  Blau et al.
7,138,629 B2 *  11/2006 Noji ..................... G01N 23/225
                                                250/310
(Continued)

FOREIGN PATENT DOCUMENTS

JP     57049248 A    3/1982
JP     11330171 A    11/1999
(Continued)

OTHER PUBLICATIONS

Tokyo Seimitsu Co Ltd., WO—PCT/JP2015/070855, Sep. 8, 2015, 4 pages.
(Continued)

*Primary Examiner* — Jermele M Hollington
*Assistant Examiner* — Douglas X Rodriguez
(74) *Attorney, Agent, or Firm* — Morgan, Lewis & Bockius LLP (57) ABSTRACT

The present invention provides a semiconductor wafer inspection apparatus and a semiconductor wafer inspection method that can suppress warpage in a semiconductor wafer due to a temperature difference between the mounting surface of a table and the semiconductor wafer. In a prober of the present invention, a semiconductor wafer is heated to have a second temperature which is equal to or lower than a first temperature in a preheating step using an oven, and then the semiconductor wafer is placed on a mounting surface of a table which is heated to the first temperature. Thus, because a temperature difference between the mounting surface of the table and the semiconductor wafer is reduced in the prober, it is possible to suppress warpage in the semiconductor wafer that occurs right after the semiconductor wafer is placed on the mounting surface.

10 Claims, 7 Drawing Sheets

(51) Int. Cl.
*G01R 31/00* (2006.01)
*H01L 21/67* (2006.01)
*H01L 21/687* (2006.01)
*G01R 1/067* (2006.01)
*H01L 21/677* (2006.01)

(52) U.S. Cl.
CPC ...... *H01L 21/677* (2013.01); *H01L 21/67103* (2013.01); *H01L 21/67109* (2013.01); *H01L 21/67115* (2013.01); *H01L 21/683* (2013.01); *H01L 21/68742* (2013.01)

(56) References Cited

U.S. PATENT DOCUMENTS

| | | | |
|---|---|---|---|
| 7,701,236 B2 * | 4/2010 | Akiyama | G01R 31/2893 324/750.16 |
| 9,704,727 B2 * | 7/2017 | Segawa | H01L 21/67017 |
| 2008/0079456 A1 * | 4/2008 | Lee | G01R 31/2893 324/750.03 |

FOREIGN PATENT DOCUMENTS

| | | |
|---|---|---|
| JP | 2000323536 A | 11/2000 |
| JP | 2001091361 A | 6/2001 |
| JP | 2013156084 A | 8/2013 |

OTHER PUBLICATIONS

Tokyo Seimitsu Co Ltd., ISR PCT/JP2015/070855, dated Sep. 8, 2015, 4 pages.
Tokyo Seimitsu Co Ltd., IPRP PCT/JP2015/070855, dated May 24, 2016, 6 pages.
Japanese Office Action 2016-199378, dated Nov. 4, 2016, 4 pgs.

* cited by examiner

RELATED ART

FIG.6

RELATED ART

SEMICONDUCTOR WAFER INSPECTION APPARATUS AND SEMICONDUCTOR WAFER INSPECTION METHOD

CROSS-REFERENCE TO RELATED APPLICATIONS

This application is a Continuation of PCT International Application No. PCT/JP2015/070855 filed on Jul. 22, 2015, which claims priority under 35 U.S.C. §119 to Japanese Patent Application No. 2014-253947 filed on Dec. 16, 2014. Each of the above applications is hereby expressly incorporated by reference, in their entirety, into the present application.

BACKGROUND OF THE INVENTION

1. Field of the Invention

The present invention relates to a semiconductor wafer inspection apparatus and a semiconductor wafer inspection method, and particularly to a semiconductor wafer inspection apparatus and a semiconductor wafer inspection method for inspecting electronic devices on a semiconductor wafer for electric characteristics.

2. Description of the Related Art

In a semiconductor manufacturing process, a plurality of chips with electronic devices are produced through various treatments to a thin plate-like semiconductor wafer. The chips are inspected for electric characteristics with the use of a semiconductor wafer inspection apparatus (also referred to as prober) and then diced for each chips by a dicing apparatus (also referred to as dicer).

A semiconductor wafer inspection apparatus includes a table, probes, and a tester, for example. In an inspecting method using the inspection apparatus, a semiconductor wafer to be inspected is placed on the mounting surface of the table and held there by adsorption. Each probe is then brought into contact with the electrode pad of the chip and signals output to the electrode of each chip are analyzed by the tester.

By the way, because electronic devices are used at a wide range of temperature, electronic devices need to be inspected, for example, at a room temperature (ambient temperature), a high temperature such as 200° C. or more, or a low temperature such as −55° C., in some cases. For this reason, some semiconductor wafer inspection apparatuses are provided with functions for inspecting in environments at these temperatures.

A conventional semiconductor wafer inspection apparatus is provided with, under the mounting surface of the table, heating and cooling means, such as a heater unit, a chiller unit, and a heat pump unit. By heating and cooling the mounting surface with the heating and cooling means, the semiconductor wafer placed on the mounting surface is heated and cooled to become the above-mentioned temperature.

In contrast, the semiconductor wafer inspection apparatus disclosed in Japanese Patent Application Laid-Open No. 2000-323536 (hereinafter referred to as PTL 1) has a cold air generator above the conductive plate (table) and the cold air generator blows cold air toward the semiconductor wafer, which is placed on the conductive plate, and the conductive plate. It also has a hot air generator below the conductive plate and the hot air generator blows hot air toward the conductive plate. The temperature of the surface of the semiconductor wafer is thus controlled with air or nitrogen gas regulated to temperatures of 25° C. and 75° C., and electronic devices are then inspected for electric characteristics with the use of probes.

SUMMARY OF THE INVENTION

By the way, inspection of electronic devices for electric characteristics at a temperature over 200° C. (e.g., 300° C.) has recently been required.

In this case, the mounting surface of the table is heated to a temperature over 200° C. by heating means and a semiconductor wafer at ambient temperature is then placed on the mounting surface of the table. However, a significantly large difference between the temperatures of the mounting surface of the table and the semiconductor wafer causes a problem of warpage in the semiconductor wafer right after the placement of the semiconductor wafer on the mounting surface of the table. This problem results from a difference in thermal expansion between the bottom surface of the semiconductor wafer in contact with the mounting surface of the table and the top surface of the semiconductor wafer exposed to air, that is, a temperature gradient due to the thickness of the semiconductor wafer.

Such warpage in the semiconductor wafer prevents the semiconductor wafer from being held on the mounting surface of the table by adsorption and sometimes causes breakage of the semiconductor wafer.

The present invention has been invented in view of the above background, and aims to provide a semiconductor wafer inspection apparatus and a semiconductor wafer inspection method that suppress warpage in a semiconductor wafer due to a difference in temperature between the mounting surface of a table and the semiconductor wafer.

In order to solve the problem, one aspect of a semiconductor wafer inspection apparatus of the present invention includes: a table having a mounting surface on which a semiconductor wafer is placed; a probe configured to be brought into contact with a semiconductor device on the semiconductor wafer placed on the mounting surface of the table and inspect the semiconductor device for electric characteristics; heating means (main heater) configured to main-heat the mounting surface of the table in order to inspect the semiconductor device for electric characteristics with the probe; and preheating means (preheating heater) configured to preheat the semiconductor wafer before the semiconductor wafer is placed on the mounting surface of the table.

In order to solve the problem, one aspect of a semiconductor wafer inspection method of the present invention includes: a inspecting step of bringing a probe into contact with a semiconductor device on a semiconductor wafer placed on a mounting surface of a table and inspecting the semiconductor device for electric characteristics; a heating step of main-heating the mounting surface of the table before the inspecting step; and a preheating step of preheating the semiconductor wafer before the semiconductor wafer is placed on the mounting surface of the table.

In one aspect of the present invention, after the semiconductor wafer is preheated in the preheating step, the semiconductor wafer is placed on the main-heated mounting surface of the table.

Thus, by the one aspect of the present invention, because a difference in temperature between the mounting surface of the table and the semiconductor wafer is reduced, it is possible to suppress warpage in the semiconductor wafer that occurs right after the semiconductor wafer is placed on the mounting surface of the table.

In the preheating step, the preheating means preheats the semiconductor wafer.

One aspect of the semiconductor wafer inspection apparatus of the present invention preferably includes: a storage unit configured to store the semiconductor wafer to be inspected with the probe; and conveyance means (conveyor, or conveyance arm) configured to convey the semiconductor wafer from the storage unit to the preheating means and to convey the semiconductor wafer which has been preheated by the preheating means to the mounting surface of the table.

One aspect of the semiconductor wafer inspection method of the present invention preferably includes: a first conveying step of conveying, before the inspecting with the probe, the semiconductor wafer from a storage unit which stores the semiconductor wafer, to preheating means in the preheating step; and a second conveying step of conveying the semiconductor wafer which has been preheated by the preheating means to the mounting surface of the table.

By the one aspect of the present invention, a storage unit which stores a semiconductor wafer to be inspected and conveyance means are provided. The conveyance means conveys the semiconductor wafer from the storage unit to the preheating means in the first conveying step, and conveys the semiconductor wafer which has been preheated by the preheating means to the mounting surface of the table in the second conveying step. Thus, it is possible to smoothly convey the semiconductor wafer to be inspected to the mounting surface of the table via the preheating means.

In one aspect of the semiconductor wafer inspection apparatus of the present invention, it is preferable that preheating means perform the preheating in a state where the semiconductor wafer is held by the conveyance means.

In one aspect of the semiconductor wafer inspection method of the present invention, it is preferable that the preheating be performed in a state where the semiconductor wafer is held by holding means (holder) in the preheating step, and the semiconductor wafer be conveyed to the mounting surface of the table in a state where the semiconductor wafer is still held by the holding means in the second conveying step.

By the one aspect of the present invention, preheating is performed in a state where the semiconductor wafer is held by conveyance means (holding means), and the semiconductor wafer is conveyed to the mounting surface of the table in a state where the semiconductor wafer is still held by the conveyance means. Thereby, because the semiconductor wafer can be preheated while eliminating a temperature gradient between the conveyance means and the semiconductor wafer, it is possible to prevent warpage of the semiconductor wafer against the conveyance means.

In one aspect of the semiconductor wafer inspection apparatus of the present invention, the preheating means preferably includes: a housing having an entrance/exit for the semiconductor wafer; and a heater configured to heat internal air of the housing.

In one aspect of the semiconductor wafer inspection method of the present invention, it is preferable that, in the preheating step, the semiconductor wafer be conveyed to internal space of a housing through an entrance/exit of the housing and the semiconductor wafer be preheated with a gas in the internal space heated by a heater.

By the one aspect of the present invention, a heater is provided in the internal space of a housing having an opening only in an entrance/exit for a semiconductor wafer, and the semiconductor wafer which is conveyed to the internal space is preheated with the gas in the internal space heated by a heater. Thus, it is possible to uniformly preheat the whole semiconductor wafer including a front surface and a rear surface of the semiconductor wafer.

In one aspect of the semiconductor wafer inspection method of the present invention, it is preferable that, in the preheating step, the semiconductor wafer be held so as to be separated from (apart from) the mounting surface of the table and preheated with heat propagated by convection or radiation from the mounting surface, and then placed on the mounting surface.

In one aspect of the present invention, the semiconductor wafer may be held so as to be separated from the mounting surface of the table by a predetermined distance (for example, several millimeters) and heated to have a second temperature with heat propagated through convection or radiation from the mounting surface of the table. Here, the preheating method of the semiconductor wafer W does not necessarily be convection or radiation from the mounting surface 18 of the table 20. The preheating method may be a heating method by heat propagated from other convection units or other radiators.

In one aspect of the semiconductor wafer inspection apparatus of the present invention, when it is assumed that a temperature of the main-heating of the mounting surface of the table by the heating means is a first temperature and a temperature of the preheating of the semiconductor wafer by the preheating means is a second temperature, it is preferable that the second temperature be the first temperature or lower.

In one aspect of the semiconductor wafer inspection method of the present invention, when it is assumed that a temperature of the main-heating of the mounting surface of the table by the heating step is a first temperature and a temperature of the preheating of the semiconductor wafer by the preheating step is a second temperature, it is preferable that the second temperature be the first temperature or lower.

By the one aspect of the present invention, it is possible to avoid disadvantageous effects due to a temperature difference between the mounting surface of the table and the semiconductor wafer, and convey the semiconductor wafer in the shortest time.

A semiconductor wafer inspection apparatus and a semiconductor wafer inspection method of the present invention can suppress warpage of a semiconductor wafer due to a difference in temperature between the mounting surface of a table and the semiconductor wafer.

DESCRIPTION OF THE EMBODIMENTS

A semiconductor wafer inspection apparatus and a semiconductor wafer inspection method according to a preferred embodiment of the present invention will now be described with reference to the attached drawings.

Figure 1:
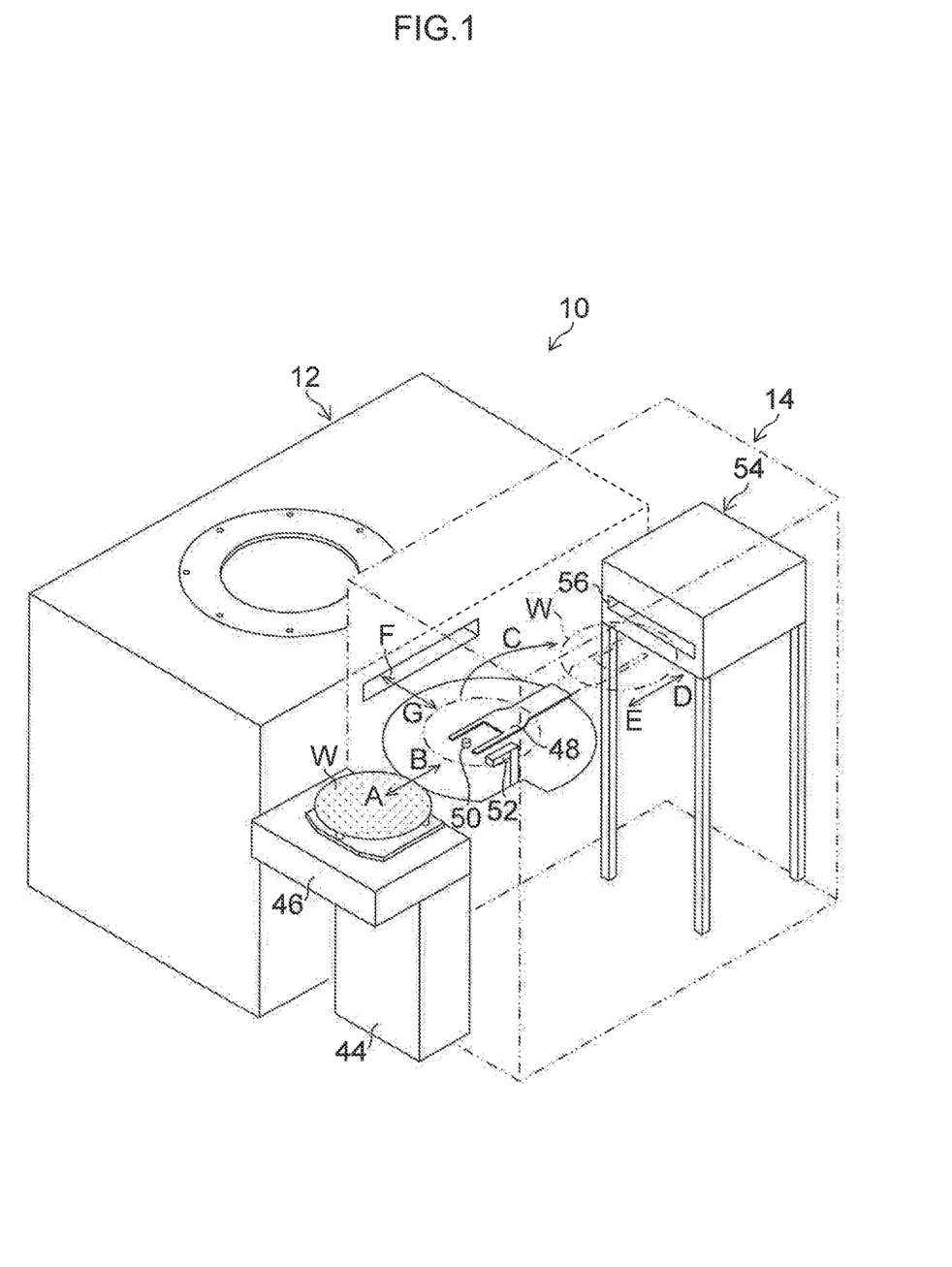
FIG. 1 is a general perspective view illustrating the structure of a prober according to an embodiment.

FIG. 1 is a general perspective view illustrating the structure of a prober (semiconductor wafer inspection apparatus) 10 according to an embodiment to which the semiconductor wafer inspection apparatus and the semiconductor wafer inspection method of the present invention are applied.

[Structure of Prober 10]

The prober 10 includes a prober body 12 and a loader unit 14 adjacent to the prober body 12. It should be noted that FIG. 1 illustrates the loader unit 14 in perspective in order to schematically show the internal structure of the loader unit 14.

<Structure and Action of Prober Body 12>

Figure 2:
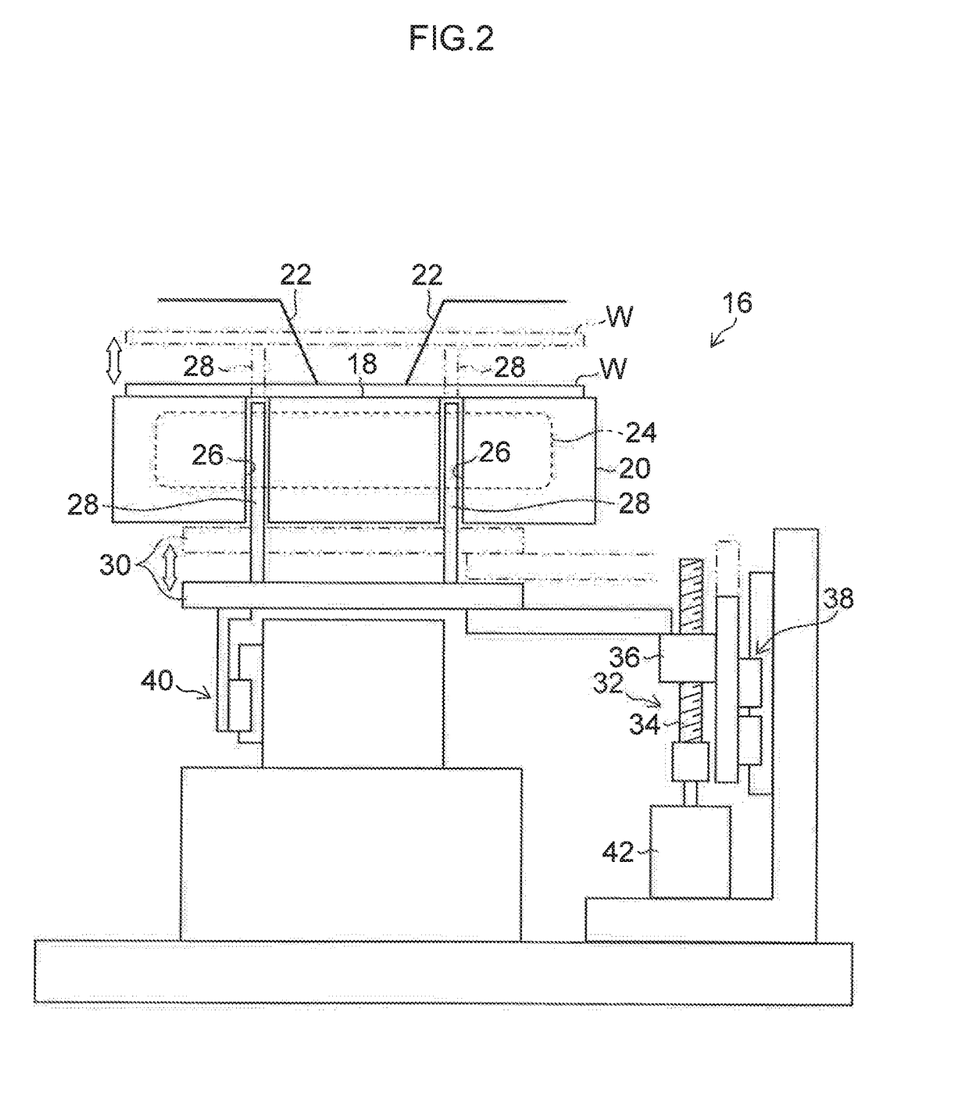
FIG. 2 is a side view illustrating an internal structure disposed inside a prober body.

FIG. 2 is a side view of an inspecting unit 16 disposed inside the prober body 12 (see FIG. 1).

The inspecting unit 16 includes a table 20 having a mounting surface 18 on which a semiconductor wafer W is placed, and probes 22 to be brought into contact with semiconductor devices (not shown in the drawing) on the semiconductor wafer W placed on the mounting surface 18 of the table 20 in order to inspect the semiconductor devices for electric characteristics. The inspecting unit 16 has, in the table 20, a heater (heating means) 24, indicated by a dashed line, which heats the mounting surface 18 of the table 20 to the first temperature (e.g., in a range of 200° C. or more to 300° C. or less) to inspect the semiconductor devices for electric characteristics with the use of the probes 22.

The table 20 has a plurality of through holes 26 vertically passing through the table. Stage pins 28, each of which is a straight rod, are inserted into the respective through holes 26. Under the table 20, the bottom end of each stage pin 28 is coupled with a horizontal surface of a plate 30 disposed horizontally. The right end part of the plate 30 is coupled with a nut 36 which is threaded on a threaded shaft 34 of a ball screw device 32.

The threaded shaft 34 is disposed vertically. The nut 36 is coupled with a linear motion guide 38 guiding the vertical motion of the nut 36. The left end of the plate 30 is provided with a linear motion guide 40 guiding the vertical motion of the plate 30.

Hence, the nut 36 can be moved in the vertical direction along the threaded shaft 34 by driving a motor 42 of the ball screw device 32 and rotating the threaded shaft 34 in a forward or reverse direction. Accordingly, moving the nut 36 upward moves the plurality of stage pins 28 upward at the same time through the plate 30 and makes the top end part of each stage pin 28 protrude from the mounting surface 18 of the table 20 as indicated by the double-dot chain lines. The semiconductor wafer W conveyed from the loader unit 14 in FIG. 1 is placed on the protruding top end of each stage pin 28.

Subsequently, the nut 36 is moved downward to embed the top end parts of the plurality of stage pins 28 under the mounting surface 18 of the table 20 as indicated by the solid line. Thus, the semiconductor wafer W is placed on the mounting surface 18 of the table 20. The semiconductor wafer W is then held on the mounting surface 18 by vacuum suction given through suction holes (not shown in the drawing) in the mounting surface 18. Afterwards, the semiconductor devices are inspected for electric characteristics with the probes 22 and the tester (not shown in the drawing). Since a known method of inspecting electric characteristics is employed here, the explanation thereof will be omitted.

<Structure and Action of Loader Unit 14>

The loader unit 14 in FIG. 1 includes a container (storage unit) 46 placed on a loading port 44, a conveyance arm (conveyance means) 48, a sub-chuck unit 50, a pre-alignment unit 52, and an oven (preheating means) 54.

A bottom surface of the semiconductor wafer W to be inspected which is accommodated in the container 46 (FIG. 1 shows the semiconductor wafer W above the container 46 for convenience of explanation) is held with vacuum adsorption (vacuum-held) by the conveyance arm 48 which has been linearly moved in the direction indicated by the arrow A. The semiconductor wafer W is then taken out of the container 46 by the linear motion of the conveyance arm 48 in the direction indicated by the arrow B and then received by the sub-chuck unit 50. The semiconductor wafer W is held on the sub-chuck unit 50 by adsorption.

The sub-chuck unit 50 is coupled with a driving unit which rotates the sub-chuck unit 50 about the vertical axis. This driving unit rotates the semiconductor wafer W adsorbed on the sub-chuck unit 50. The rotation movement of the semiconductor wafer W caused by the driving unit allows a sensor (not shown in the drawing) of the pre-alignment unit 52 to detect the positions of the notches or orientation flats of the semiconductor wafer W. Thus, the semiconductor wafer W is located. In other words, the semiconductor wafer W is rotated to be set at a target angle and positioned in a predetermined position. Through this action, pre-alignment is completed which is performed before the semiconductor wafer W is placed on the mounting surface 18 of the table 20 in the prober body 12.

Upon completion of the pre-alignment, the bottom surface of the semiconductor wafer W is held with adsorption by the conveyance arm 48. The conveyance arm 48 is then turned by 180° in the direction indicated by the arrow C so that the semiconductor wafer W faces an entrance/exit 56 of an oven 54. The semiconductor wafer W is then conveyed from the entrance/exit 56 of the oven 54 to the internal space of the oven 54 along with the conveyance arm 48 by the linear motion of the conveyance arm 48 in the direction indicated by arrow D.

Figure 3:
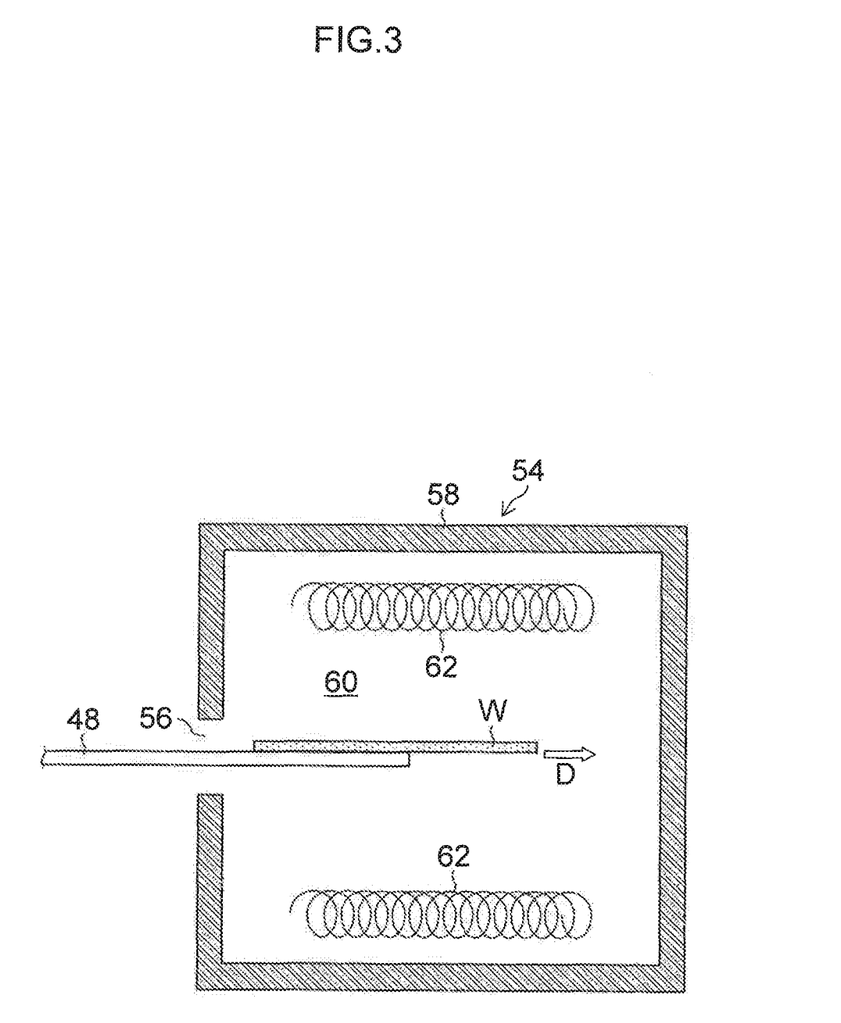
FIG. 3 is a longitudinal cross-sectional view of an oven.

FIG. 3 is a longitudinal cross-sectional view of the oven 54.

The oven 54 includes a housing 58 having the entrance/exit 56, and a plurality of electric heaters (heaters) 62 disposed in the internal space 60 of the housing 58.

The electric heaters 62 are disposed on the ceiling, floor, and, if necessary, sidewalls of the housing 58 and generate heat with a voltage applied by a power source, thereby heating the gas (inner air) in the internal space 60 to have the second temperature (e.g., in a range of 200° C. or more to 300° C. or less) which is equal to or lower than the first temperature. Accordingly, the whole semiconductor wafer W including the bottom surface (rear surface) and the top surface (front surface) of the semiconductor wafer W, is uniformly heated to have the second temperature. In order to detect that the temperature of the semiconductor wafer W reaches the second temperature by the heating, it is preferable to use a detection method in which an increase in temperature of the semiconductor wafer W corresponding to the heating time is actually measured and then the heating time is controlled according to the measured data. The housing 58 is made of a heat-resistant ceramic and preferably has a heat insulator on its outer wall. The conveyance arm 48 is also made of a heat-resistant ceramic.

When the temperature of the semiconductor wafer W reaches the second temperature by the heating with the oven 54, the semiconductor wafer W is taken out from the oven 54 through the entrance/exit 56 of the oven 54 by the linear motion of the conveyance arm 48 in the direction indicated by the arrow E in FIG. 1. The semiconductor wafer W is then conveyed into the prober body 12 by the linear motion of the conveyance arm 48 in the direction indicated by the arrow F and then received by the top end parts of the stage pins 28 indicated by the double-dot chain lines in FIG. 2. Subsequently, the conveyance arm 48 is linearly moved in the direction indicated by the arrow G in FIG. 1 and returns to the initial position.

It should be noted that, during conveyance from the oven 54 to the stage pins 28, which requires about 20 seconds, the ceramic conveyance arm 48, which has a larger heat capacity than the semiconductor wafer W, is also heated to suppress a decrease in the temperature of the semiconductor wafer W during the conveyance. Consequently, because the semiconductor wafer W is maintained to have a temperature close to the first temperature of the mounting surface 18 of the table 20, it is possible to suppresses warpage in the semiconductor wafer that occurs when the semiconductor wafer is conveyed by the mounting surface 18

Further, when the semiconductor wafer W is preheated by the oven 54, it can be also considered that the semiconductor wafer W is detached from the conveyance arm 48 while being preheated. In this case, however, after the preheating of the semiconductor wafer W, the semiconductor wafer W may warp against the conveyance arm 48 due to a temperature gradient that occurs between the conveyance arm 48 and the semiconductor wafer W when the semiconductor wafer W is held again on the conveyance arm 48 by adsorption.

On the contrary, in the embodiment, the semiconductor wafer W is preheated while being held by the conveyance arm (holding means) 48 and then is conveyed onto the mounting surface of the table 20 while being still held by the conveyance arm 48. This allows the semiconductor wafer W to be preheated without a temperature gradient between the conveyance arm 48 and the semiconductor wafer W, thereby avoiding warpage in the semiconductor wafer W against the conveyance arm 48.

[Features of Prober 10]

Figure 4:
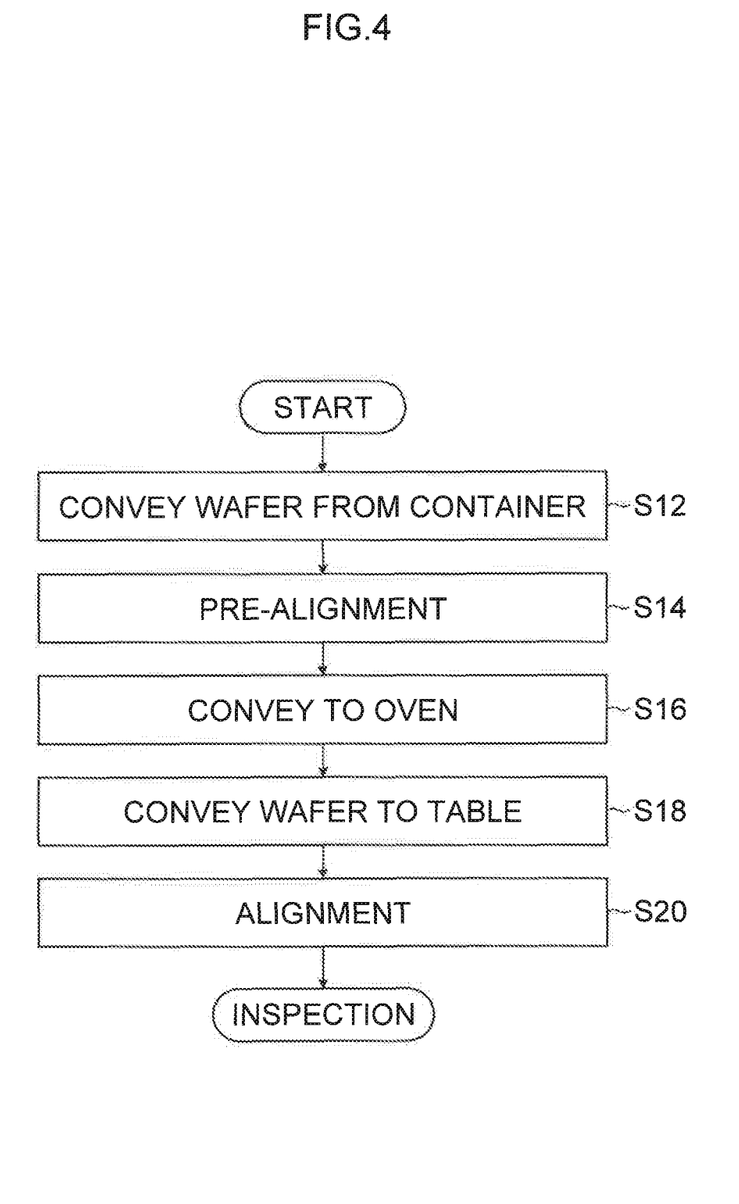
FIG. 4 is a flowchart of a semiconductor wafer inspection method according to an embodiment.

FIG. 4 is a flowchart of a method of inspecting the semiconductor wafer W with the prober 10 according to the embodiment.

Referring to FIG. 4, the method includes a step of conveying the semiconductor wafer W out of the container 46 in FIG. 1 (S (Step) 12), a step of pre-aligning the semiconductor wafer W with the use of the pre-alignment unit 52 (S14), a preheating step of conveying the semiconductor wafer W to the oven 54 and preheating the semiconductor wafer W to have the second temperature (S16), a step of conveying the preheated semiconductor wafer W to the table 20 (S18), a step of aligning the semiconductor wafer W on the table 20 (S20), and an inspecting step of inspecting the semiconductor wafer W for electric characteristics in the inspecting unit 16 in FIG. 2. The method also includes, prior to the step S18, a heating step of heating the mounting surface 18 of the table 20 to have the first temperature with the heater 24.

That is, in the prober 10 according to the embodiment, after the semiconductor wafer W is heated to have the second temperature which is equal to or lower than the first temperature in the preheating step (S16), the semiconductor wafer W is placed on the mounting surface 18 of the table 20 which is heated to have the first temperature.

It is preferable that the preheating temperature in the preheating step (S16) be the second temperature which is equal to or lower than the first temperature because it is possible to avoid disadvantageous effects (also referred to as thermal shock) due to a temperature difference between the mounting surface 18 of the table 20 and the semiconductor wafer W, and achieve conveyance in the shortest time. However, the preheating temperature which is the second temperature may be the first temperature or higher.

In other words, the preheating temperature in the preheating step (S16) may be equal to or higher than the first temperature as long as the temperature does not cause warpage in the semiconductor wafer W due to a temperature gradient between the mounting surface 18 and the semiconductor wafer W when the semiconductor wafer W is placed on the mounting surface 18 of the table 20.

Thus, in the prober 10 according to the embodiment, because the temperature difference between the mounting surface 18 of the table 20 and the semiconductor wafer W becomes small, it is possible to suppress warpage in the semiconductor wafer that occurs right after it is placed on the mounting surface 18.

An inspecting method with a conventional prober will now be explained.

Figure 5:
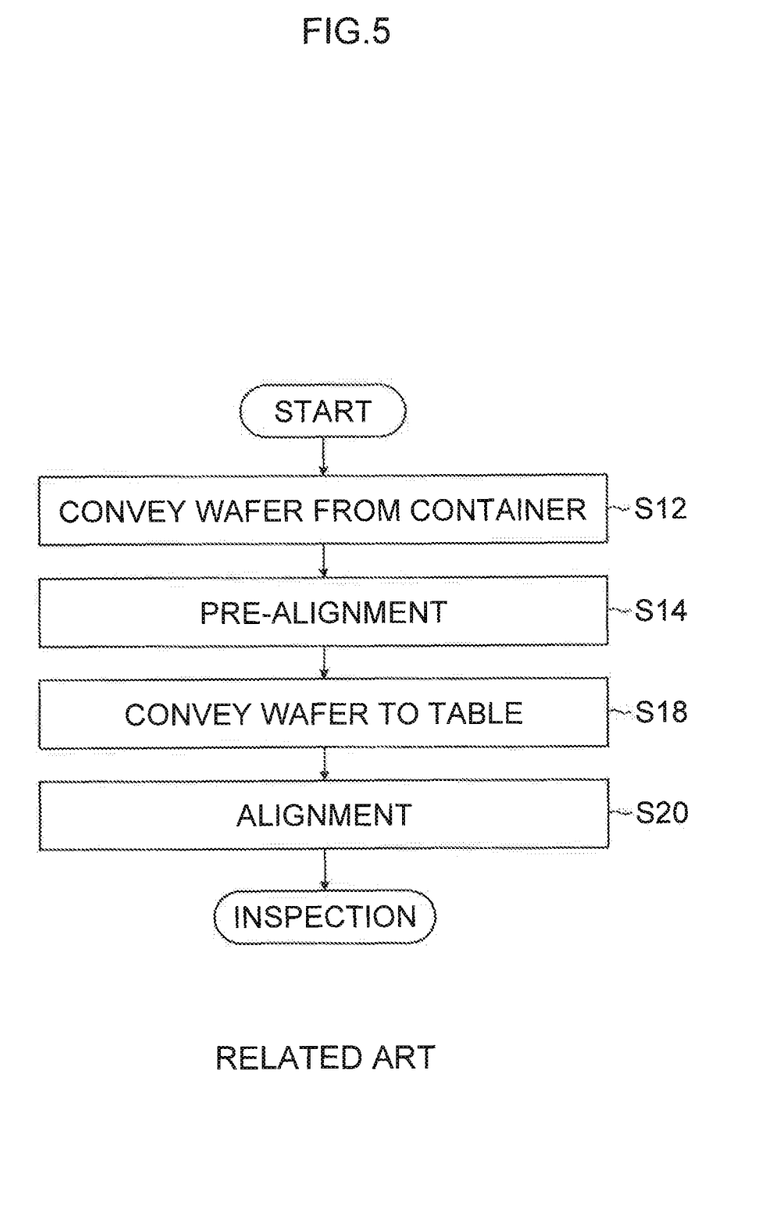
FIG. 5 is a flowchart of a conventional semiconductor wafer inspection method.
Figure 6:
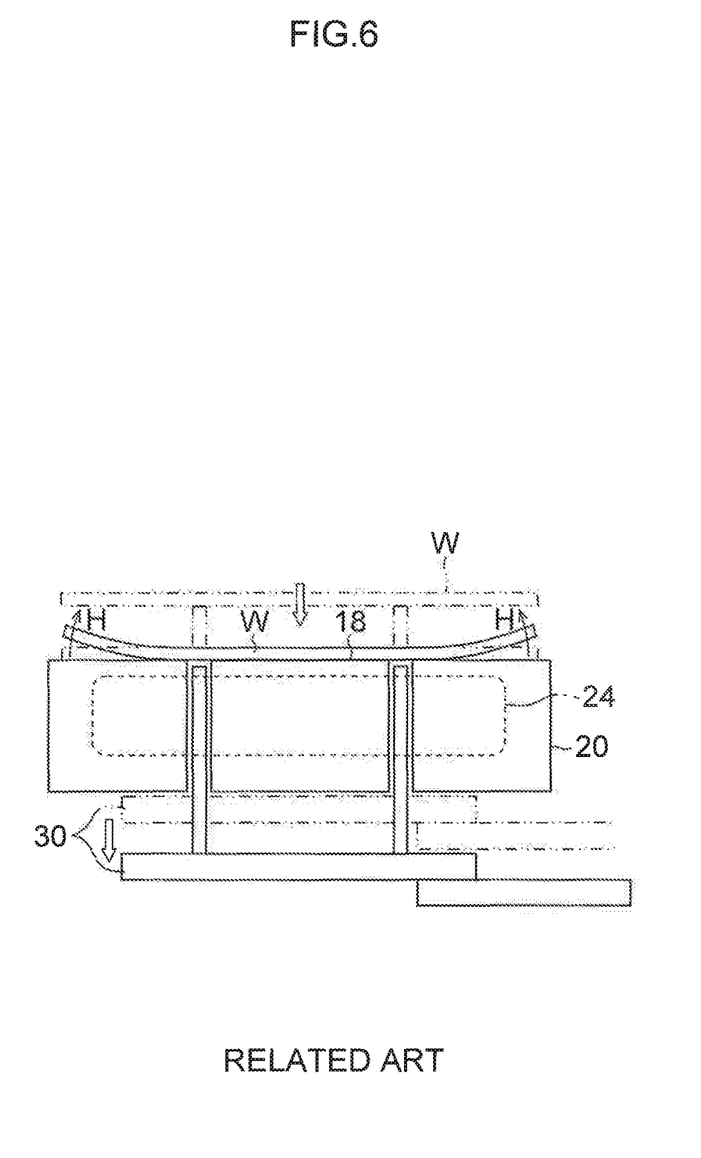
FIG. 6 is a diagram illustrating the state of warpage in a semiconductor wafer in a conventional apparatus.

FIG. 5 is a flowchart of a semiconductor wafer inspection method with a conventional prober. FIG. 6 is a side view of the inspecting unit 16 to describe the state of warpage in the semiconductor wafer W caused in the conventional prober.

A conventional inspection method illustrated in FIG. 5 differs from the inspection method according to the embodiment illustrated in FIG. 4 in that it does not include the preheating step S16.

For this reason, when the semiconductor wafer W at an ambient temperature (normal temperature) is placed on the mounting surface 18 of the table 20 which is heated to have the first temperature in the manner shown in FIG. 5, a significantly large temperature difference between the mounting surface 18 and the semiconductor wafer W causes a problem of warpage in the semiconductor wafer in the direction indicated by the arrow H right after the semiconductor wafer W is placed on the mounting surface 18.

In contrast, because the prober 10 according to the embodiment involves the preheating step S16, the temperature difference between the semiconductor wafer W and the mounting surface 18 is minimized. Thus, it is possible to suppress warpage in the semiconductor wafer W that occurs just after the semiconductor wafer W is placed on the mounting surface 18.

It should be noted that, although the oven 54 serving as preheating means in the preheating step is provided in the embodiment, the semiconductor wafer W can be preheated to have the second temperature even when the preheating means is not provided.

Figure 7:
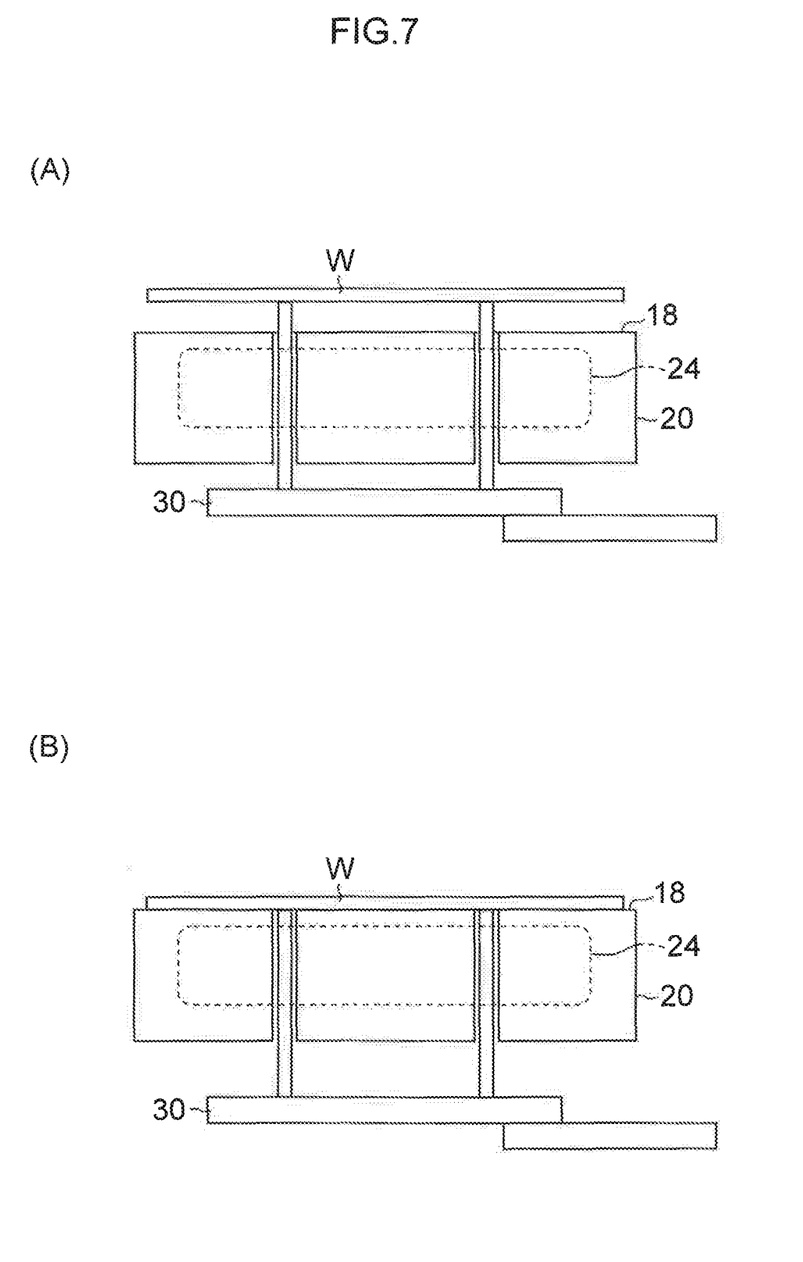
FIG. 7 is diagrams illustrating another form of a preheating step of preheating a semiconductor wafer W.

Portions (A) and (B) of FIG. 7 illustrate other form of the preheating step of preheating the semiconductor wafer W.

In the other forms illustrated in FIG. 7, the semiconductor wafer W is held such that the semiconductor wafer W is separated from the mounting surface 18 of the table 20 by a predetermined distance (for example, several millimeters) with the stage pins 28 and heated to have the second temperature with heat propagated through convection or radiation from the mounting surface 18 (see the Portion (A) in FIG. 7). The semiconductor wafer W is then placed on the mounting surface 18 having the first temperature by moving the stage pins 28 downward (see the Portion (B) of FIG. 7). Here, the preheating method of the semiconductor wafer W does not necessarily be convection or radiation from the mounting surface 18 of the table 20. The preheating method may be a heating method by heat propagated from other convection units or other radiators.

Further, the prober 10 according to the embodiment includes the container 46 and the conveyance arm 48 that conveys the semiconductor wafer W from the container 46 to the oven 54 and conveys the semiconductor wafer W preheated by the oven 54 to the mounting surface 18 of the table 20.

That is, the inspection method with the prober 10 includes a first conveying step of conveying the semiconductor wafer W from the container 46 containing the semiconductor wafer W, to the oven 54, and a second conveying step of conveying the semiconductor wafer W preheated by the oven 54 to the mounting surface 18 of the table 20.

Thus, by the prober 10 according to the embodiment, it is possible to smoothly convey the semiconductor wafer W to be inspected to the mounting surface 18 of the table 20 via the oven 54.

Further, by the prober 10 of the embodiment, it is possible to uniformly heat the whole semiconductor wafer W including the bottom surface and the top surface of the semiconductor wafer W to have the second temperature by the oven 54. This is significantly effective in suppressing warpage in the semiconductor wafer W.

What is claimed is:

1. A semiconductor wafer inspection apparatus which brings a probe into contact with a semiconductor device on a semiconductor wafer placed on a heated table and inspects electric characteristics of the semiconductor device, comprising:
   a preheating heater configured to preheat the semiconductor wafer; and
   a conveyance arm configured to convey the semiconductor wafer to the preheating heater and to convey the semiconductor wafer which has been preheated by the preheating heater to the table, wherein
   the preheating heater preheats the semiconductor wafer while the semiconductor wafer is held by the conveyance arm, a first portion of the conveyance arm is disposed within the preheating heater, and a second portion of the conveyance arm is disposed outside the preheating heater.

2. The semiconductor wafer inspection apparatus according to claim 1, wherein
   the preheating heater preheats the semiconductor wafer in a position separated from the table with heat propagated by convection or radiation from the table in a state where the semiconductor wafer is held by the conveyance arm.

3. The semiconductor wafer inspection apparatus according to claim 1, wherein the preheating heater comprises:
   a housing having an entrance/exit for the semiconductor wafer; and
   a heater configured to heat internal space of the housing.

4. The semiconductor wafer inspection apparatus according to claim 1, wherein
   the conveyance arm is configured to rotate for receiving and conveying the semiconductor wafer.

5. The semiconductor wafer inspection apparatus according to claim 1, wherein the conveyance arm includes a heat-resistant ceramic.

6. A semiconductor wafer inspection method in which a probe is brought into contact with a semiconductor device on a semiconductor wafer placed on a heated table and the semiconductor device is inspected for electric characteristics, comprising:
   a preheating step of preheating the semiconductor wafer; and
   a conveyance step of conveying the semiconductor wafer to a preheating position and conveying the semiconductor wafer which has been preheated in the preheating position to the table, wherein
   in the preheating step, the semiconductor wafer is preheated while the semiconductor wafer is held by a conveyance arm which conveys the semiconductor wafer, a first portion of the conveyance arm is disposed within the preheating heater, and a second portion of the conveyance arm is disposed outside the preheating heater.

7. The semiconductor wafer inspection method according to claim 6, wherein
   the preheating step is a step of preheating the semiconductor wafer in a housing, wherein the semiconductor wafer is preheated in the preheating position in the housing in a state where the semiconductor wafer is held by the conveyance arm.

8. The semiconductor wafer inspection method according to claim 6, wherein
   in the preheating step, the semiconductor wafer is preheated in the preheating position separated from the table with heat propagated by convection or radiation from the table in a state where the semiconductor wafer is held by the conveyance arm.

9. The semiconductor wafer inspection method according to claim 6, wherein
   in the conveyance step, the conveyance arm rotates from a receiving position for conveying the semiconductor wafer.

10. The semiconductor wafer inspection method according to claim 6, wherein the conveyance arm includes a heat-resistant ceramic.

* * * * *